(12) United States Patent
Simin et al.

(10) Patent No.: US 9,178,025 B2
(45) Date of Patent: Nov. 3, 2015

(54) LOW-RESISTANCE ELECTRODE DESIGN

(71) Applicant: Sensor Electronic Technology, Inc., Columbia, SC (US)

(72) Inventors: Grigory Simin, Columbia, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 14/499,652

(22) Filed: Sep. 29, 2014

(65) Prior Publication Data
US 2015/0014857 A1    Jan. 15, 2015

Related U.S. Application Data

(63) Continuation of application No. 13/458,213, filed on Apr. 27, 2012, now Pat. No. 8,846,473, which is a continuation-in-part of application No. 12/791,259, filed on Jun. 1, 2010, now Pat. No. 8,168,497.

(60) Provisional application No. 61/217,532, filed on Jun. 1, 2009.

(51) Int. Cl.
| | |
|---|---|
| *H01L 29/66* | (2006.01) |
| *H01L 29/417* | (2006.01) |
| *G06F 17/50* | (2006.01) |
| *H01L 23/482* | (2006.01) |
| *H01L 23/64* | (2006.01) |

(52) U.S. Cl.
CPC ...... *H01L 29/41758* (2013.01); *G06F 17/5068* (2013.01); *H01L 23/4824* (2013.01); *H01L 23/647* (2013.01); *H01L 2924/0002* (2013.01)

(58) Field of Classification Search
CPC .............. H01L 2924/13091; H01L 2924/0002
See application file for complete search history.

(56) References Cited

U.S. PATENT DOCUMENTS

| | | | |
|---|---|---|---|
| 3,982,113 A | 9/1976 | Coldren | |
| 4,933,740 A * | 6/1990 | Baliga et al. | 257/162 |
| 7,687,902 B2 | 3/2010 | Shiraishi et al. | |
| 7,981,747 B2 * | 7/2011 | Shiraishi et al. | 438/270 |
| 8,168,497 B2 | 5/2012 | Simin et al. | |
| 8,846,473 B2 | 9/2014 | Simin et al. | |
| 2007/0228534 A1 | 10/2007 | Uno et al. | |
| 2010/0301471 A1 | 12/2010 | Simin et al. | |

OTHER PUBLICATIONS

Z. Yang et al, "Current Crowding in High Performance Low-Loss HFET RF Switches", IEEE Electron Device Letters, vol. 29, No. 1, Jan. 2008, pp. 15-17.
Stevensen, Office Action for U.S. Appl. No. 13/458,213, Dec. 13, 2013, 18 pages.
Stevensen, Notice of Allowance for U.S. Appl. No. 13/458,213, May 27, 2014, 8 pages.

* cited by examiner

*Primary Examiner* — Zandra Smith
*Assistant Examiner* — Andre' C Stevenson
(74) *Attorney, Agent, or Firm* — LaBatt, LLC

(57) ABSTRACT

A solution for designing a semiconductor device, in which two or more attributes of a pair of electrodes are determined to, for example, minimize resistance between the electrodes, is provided. Each electrode can include a current feeding contact from which multiple fingers extend, which are inter-digitated with the fingers the other electrode in an alternating pattern. The attributes can include a target depth of each finger, a target effective width of each pair of adjacent fingers, and/or one or more target attributes of the current feeding contacts. Subsequently, the device and/or a circuit including the device can be fabricated.

27 Claims, 5 Drawing Sheets

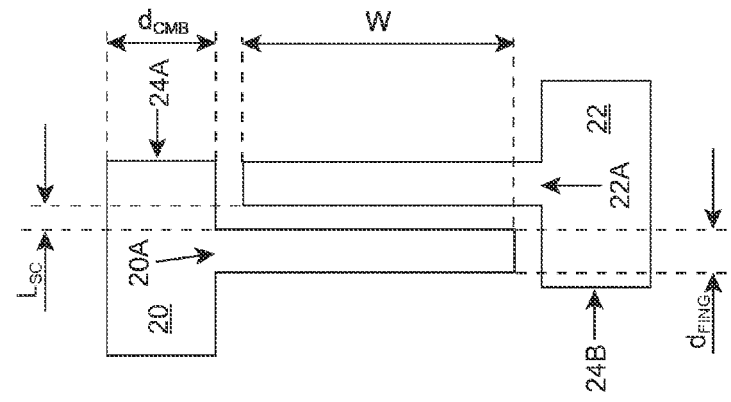
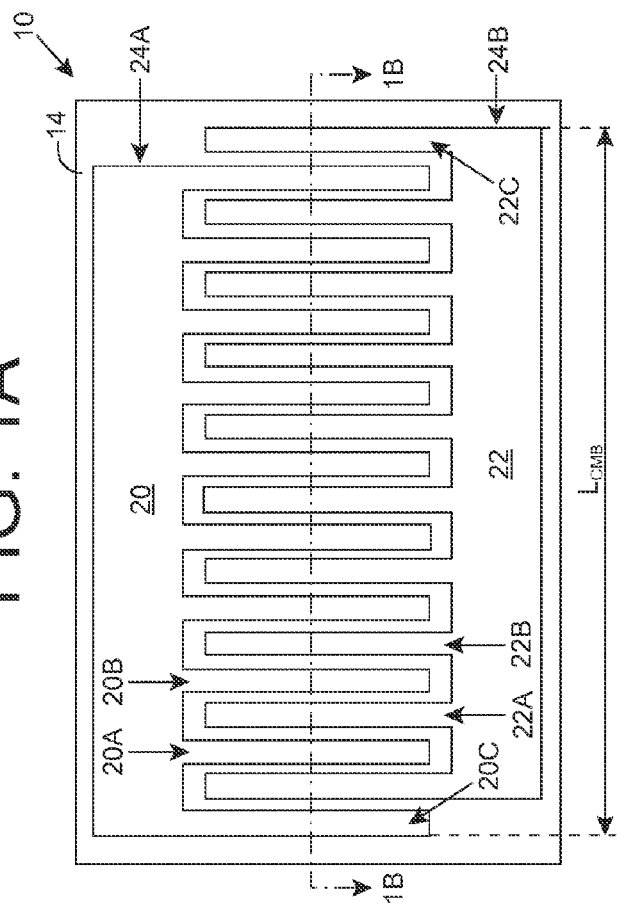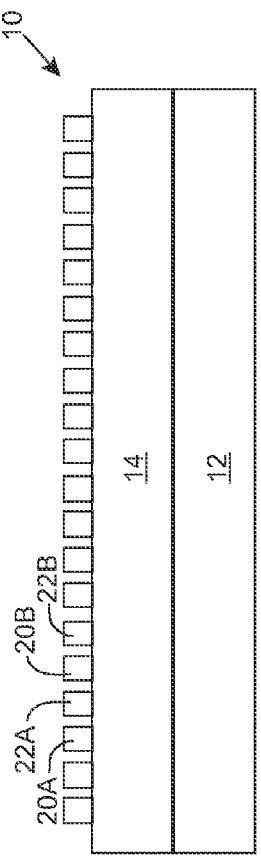

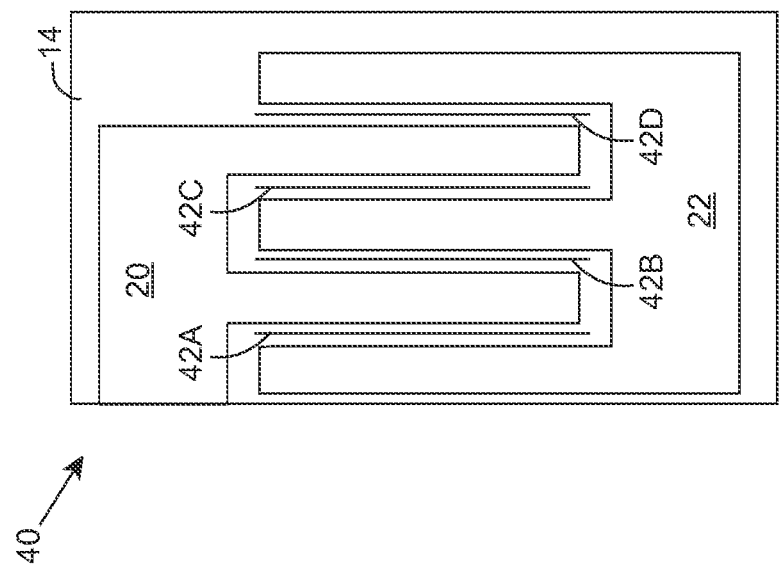

LOW-RESISTANCE ELECTRODE DESIGN

REFERENCE TO PRIOR APPLICATIONS

The current application is a continuation of co-pending U.S. patent application Ser. No. 13/458,213, titled "Low-Resistance Electrode Design," which was filed on 27 Apr. 2012, which is a continuation-in-part of U.S. patent application Ser. No. 12/791,259, titled "Low-Resistance Electrode Design," which was filed on 1 Jun. 2010, and which claims the benefit of U.S. Provisional Application No. 61/217,532, titled "Low-resistance semiconductor device," which was filed on 1 Jun. 2009, all of which are hereby incorporated by reference.

TECHNICAL FIELD

The disclosure relates generally to semiconductor devices, and more particularly, to an improved electrode design for semiconductor devices.

BACKGROUND ART

On state resistance is an important characteristic of a semiconductor device, such as a semiconductor device used in any of various switching applications. A low on state resistance in a planar device, such as a field effect transistor (FET) or a diode, is generally achieved by the use of multi-finger structures for pairs of electrodes. The multi-finger structures increase the total periphery of each electrode.

The development and implementation of devices with a semiconductor structure with extremely low sheet resistance, e.g., 200-300 Ohms/square, presents new considerations in the design of devices with low on state resistance. For example, when a low on state resistance device is manufactured using semiconductor layer(s) with very low sheet resistance, the resistance of the semiconductor layer becomes comparable to that of the metal electrodes supplying the current to the device. In this case, the current density along the device finger becomes non-uniform. As a result, the device resistance does not decrease inversely proportionally to the finger width (e.g., the size of the dimension of the finger that is perpendicular to the direction of the current flow between the electrodes). Instead, as the finger width is increased, the device resistance per unit finger width first decreases, flattens over a range of widths, and then increases as the width is further increased.

SUMMARY OF THE INVENTION

Aspects of the invention provide a solution for designing a semiconductor device, in which two or more attributes of a pair of electrodes are determined to, for example, minimize resistance between the electrodes. Each electrode can include a current feeding contact from which multiple fingers extend, the fingers are interdigitated with the fingers of the other electrode in an alternating pattern. The attributes can include a target depth of each finger, a target effective width of each pair of adjacent fingers, and/or one or more target attributes of the current feeding contacts. Subsequently, the device and/or a circuit including the device can be fabricated. In this manner, a low total device impedance can be achieved.

A first aspect of the invention provides a method of designing a semiconductor device, the method comprising: configuring a set of attributes of an interface between a first electrode to a semiconductor structure of the semiconductor device and a second electrode to the semiconductor structure, wherein each electrode includes a current feeding contact and a plurality of fingers extending therefrom, and wherein the plurality of fingers of the first and second electrodes are adjacent to each other in an alternating pattern, the configuring including determining at least one target attribute of the current feeding contact of each of the first and second electrodes based on at least one of: a target depth, $d_{FING}$, for each of the plurality of fingers, a target effective width, W, of each pair of adjacent fingers of the first electrode and the second electrode, an impedance of the current feeding contact per unit width, $Z_{CMB}$, and an impedance of a pair of adjacent fingers with the semiconductor structure there between per unit width, $Z_{FINGSC}$.

A second aspect of the invention provides a method of fabricating a semiconductor device, the method comprising: designing the semiconductor device, wherein the designing includes configuring a set of attributes of an interface between a first electrode to a semiconductor structure of the semiconductor device and a second electrode to the semiconductor structure, wherein each electrode includes a current feeding contact and a plurality of fingers extending therefrom, and wherein the plurality of fingers of the first and second electrodes are adjacent to each other in an alternating pattern, the configuring including determining at least one target attribute of the current feeding contact of each of the first and second electrodes based on at least one of: a target depth, $d_{FING}$, for each of the plurality of fingers, a target effective width, W, of each pair of adjacent fingers of the first electrode and the second electrode, an impedance of the current feeding contact per unit width, $Z_{CMB}$, and an impedance of a pair of adjacent fingers with the semiconductor structure there between per unit width, $Z_{FINGSC}$; and forming each of the first and second electrodes on the semiconductor structure according to the design.

A third aspect of the invention provides a method comprising: designing a semiconductor device, wherein the designing includes configuring a set of attributes of an interface between a first electrode to a semiconductor structure of the semiconductor device and a second electrode to the semiconductor structure, wherein each electrode includes a current feeding contact and a plurality of fingers extending therefrom, and wherein the plurality of fingers of the first and second electrodes are adjacent to each other in an alternating pattern, the configuring including: determining a first target value for an attribute in the set of attributes based on a set of operating frequencies for the device, wherein the target value is calculated to optimize the attribute for performance of the device at a set of target operating frequencies; determining a second target value for another attribute in the set of attributes based on the first target value; and determining at least one target attribute of the current feeding contact of each of the first and second electrodes based on at least one of: a target depth, $d_{FING}$, for each of the plurality of fingers, a target effective width, W, of each pair of adjacent fingers of the first electrode and the second electrode, an impedance of the current feeding contact per unit width, $Z_{CMB}$, and an impedance of a pair of adjacent fingers with the semiconductor structure there between per unit width, $Z_{FINGSC}$.

Other aspects of the invention provide methods, systems, program products, and methods of using and generating each, which include and/or implement some or all of the actions described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 1A and 1B show top and side views, respectively, of an illustrative device according to an embodiment.

FIG. 1C shows a top view of an illustrative pair of adjacent fingers according to an embodiment.

FIG. 4 shows a portion of another illustrative electrode configuration for a device according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 2:
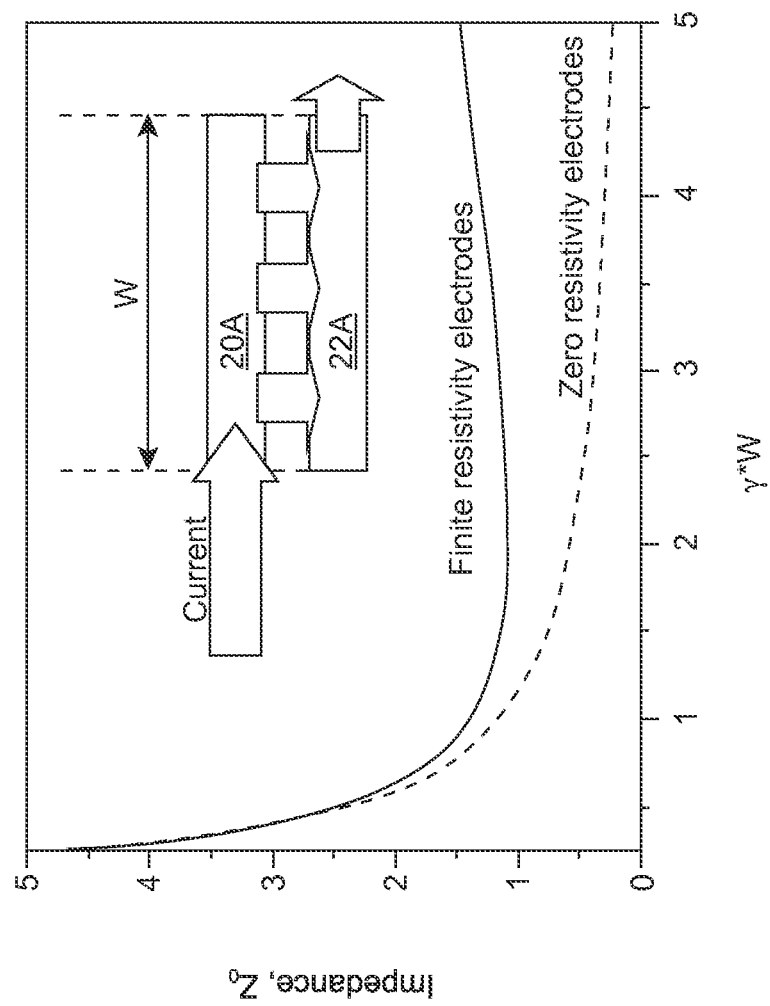
FIG. 2 shows an illustrative diagram of the dependence of the impedance of a device on the width of the electrodes according to an embodiment.

As indicated above, aspects of the invention provide a solution for designing a semiconductor device, in which two or more attributes of a pair of electrodes are determined to, for example, minimize resistance between the electrodes. Each electrode can include a current feeding contact from which multiple fingers extend, the fingers are interdigitated with the fingers of the other electrode in an alternating pattern. The attributes can include a target depth of each finger, a target effective width of each pair of adjacent fingers, and/or one or more target attributes of the current feeding contacts. Subsequently, the device and/or a circuit including the device can be fabricated. In this manner, a low total device impedance can be achieved. As used herein, unless otherwise noted, the term "set" means one or more (i.e., at least one) and the phrase "any solution" means any now known or later developed solution.

Turning to the drawings, FIGS. 1A and 1B show top and side views, respectively, of an illustrative device 10 according to an embodiment. In general, device 10 comprises a planar semiconductor device with a lateral layout. To this extent, device 10 can comprise a highly resistive substrate 12 with a semiconductor structure 14 comprising one or more semiconducting layers formed thereon. Substrate 12 can comprise any type of substrate, such as sapphire, silicon, silicon carbide, or any other semiconductor or dielectric materials. Semiconductor structure 14 can comprise, for example: a group-III nitride heterostructure, which includes two or more layers of materials selected from the group-III nitride material system (e.g., $Al_X In_Y Ga_{1-X-Y} N$, where $0 \leq X, Y \leq 1$, and $X+Y \leq 1$ and/or alloys thereof); a group-III arsenide heterostructure, which includes two or more layers of materials selected from the group-III arsenide material system (e.g., $Al_X Ga_{1-X} As$, where $0 \leq X \leq 1$ and/or alloys thereof); and/or the like.

Device 10 is shown including a pair of electrodes 20, 22. In order to design the semiconductor device 10, a type of contact to the semiconductor structure 14 can be selected for each electrode 20, 22 using any solution. Each electrode 20, 22 can comprise, for example, a metal, and form any type of contact to the semiconductor structure 14. For example, each electrode 20, 22 can form an ohmic contact, a capacitively-coupled contact, a composite conducting capacitive coupled contact, and/or the like to the semiconductor structure 14. Electrodes 20, 22 can form the same type of contact or different types of contacts to the semiconductor structure 14 for a particular device 10, depending on the desired application and/or operating characteristics for the device 10.

Also as part of designing the semiconductor device 10, a shape configuration of the electrodes 20, 22 and the corresponding locations of the electrodes 20, 22 can be designed. The shape configuration can be selected/designed to provide one or more benefits to the operation of the semiconductor device 10 using any solution. For example, as illustrated, each electrode 20, 22 can comprise a multi-finger electrode having a comb configuration, which includes multiple fingers, such as fingers 20A-20C, 22A-22C, respectively, electrically connected in parallel by a current feeding contact 24A, 24B from which each finger 20A-20C, 22A-22C, respectively extends. The respective fingers 20A-20C, 22A-22C of each electrode 20, 22 can be physically arranged in an alternating manner (e.g., interdigitated). In operation, current can flow from one electrode 20, 22 to the other electrode 20, 22. For example, electrode 20 can comprise a source contact, while electrode 22 comprises a drain contact for the device 10. In this case, under forward bias operating conditions of device 10, current can flow from the fingers 20A-20C of electrode 20 to the fingers 22A-22C of electrode 22 via the semiconductor structure 14. To this extent, the current can enter fingers 20A-20C via current feeding contact 24A and leave fingers 22A-22C via current feeding contact 24B.

FIG. 1C shows a top view of an illustrative pair of adjacent fingers 20A, 22A according to an embodiment. As illustrated, each finger 20A, 22A comprises a corresponding depth, $d_{FING}$, and each pair of fingers 20A, 22A on electrodes 20, 22 comprises a corresponding effective width, W. The effective width W of each pair of fingers 20A, 22A is a size of the dimension of the pair of fingers 20A, 22A that is perpendicular to the current flow direction between the electrodes 20, 22. Since the current flows between adjacent fingers 20A, 22A primarily in a horizontal direction in FIGS. 1A-1C, the effective width W can correspond to the portions of the vertical lengths of the fingers 20A, 22A that are horizontally adjacent to one another. Moreover, the semiconductor structure 14 (FIG. 1A) separating each pair of fingers 20A, 22A has a corresponding length, $L_{SC}$, over which the current travels. Additional measurements of electrodes 20, 22 include a depth of the current feeding contact 24A, 24B, $d_{CMB}$, of each electrode and a total length of the comb interface between the two electrodes 20, 22, $L_{CMB}$, as shown in FIG. 1A.

An embodiment of the invention provides a solution for designing and/or fabricating electrodes 20, 22 of a semiconductor device 10 to achieve a lower total resistance for device 10, which includes determining one or more target attributes of the electrodes 20, 22. For example, a target effective width W of the respective electrodes 20, 22 can be determined according to an embodiment. Subsequently, the design of the semiconductor device 10 can include configuring the electrodes 20, 22 according to the target effective width W. For example, one or more attributes of the electrodes 20, 22 can be selected according to the target effective width W.

When the electrodes 20, 22 comprise multi-finger electrodes as shown in FIGS. 1A, 1B, the effective width W of each electrode 20, 22 corresponds to the effective width W of the respective pairs of fingers 20A, 22A and 20B, 22B. The target effective width W can be selected to reduce the impedance of the device 10, e.g., by reducing non-uniformity of the current along the electrodes 20, 22 in a direction that is perpendicular to the current flow between the electrodes 20, 22. Such non-uniformity can occur due to a finite resistance of the electrodes 20, 22 deposited over a highly-conducting semiconductor structure 14. In an illustrative embodiment, the target effective width W of electrodes 20, 22 corresponds to the effective width at which the impedance of the device 10 is close to the impedance obtained with ideally conducting metal electrodes 20, 22.

FIG. 2 shows an illustrative diagram of the dependence of the impedance of a device, such as device 10 (FIG. 1), on the effective width W of the electrodes 20A, 22A according to an embodiment. As illustrated in the inset of the diagram, the input current can enter the top electrode 20A from the left and leave the bottom electrode 22A from the right. If a resistance of the metal of each electrode 20A, 22A is zero, the top electrode 20A and bottom electrode 22A would be equipotential, and the current density through the semiconductor structure 14 (FIG. 1) between the electrodes 20A, 22A would be uniform from left to right in the inset. However, due to a finite resistance of the metal of the electrodes 20A, 22A, the current creates a voltage drop along the electrodes 20A, 22A causing a current density to decrease in the central part of the electrodes 20A, 22A.

The non-uniformity of the current along the effective width W of the electrodes 20A, 22A can be derived from the signal propagation along a distributed line formed by a series impedance of the electrodes 20A, 22A and a shunting admittance of the semiconductor structure 14 connected between the electrodes 20A, 22A. From the general transmission line theory, the propagation constant in such a Z-Y line is $\gamma_{FING}=\sqrt{Z_1 Y_1}$, where $Z_1$ and $Y_1$ are the line series impedance and shunting admittance per unit length, respectively. For the transmission line described herein, $Z_1=2 \times Z_{FING}$ and $Y_1=Y_{SC}=1/Z_{SC}$, where $Z_{FING}$ is an impedance of a metal electrode 20A, 22A per unit width and $Z_{SC}$ is an impedance of the semiconducting structure 14 between the electrodes 20A, 22A per unit width. $Z_{FING}$ can be calculated, for example, using the formula $Z_{FING}=R_{SHFING}/d_{FING}$, where $R_{SHFING}$ is the sheet resistance of a finger and $d_{FING}$ is the depth of the finger. A factor of two can be used in calculating $Z_1$ to account for the resistances of the two electrodes 20A, 22A connected in series in each unit cell of the Z-Y transmission line. Similarly, the resistances of the two electrodes 20A, 22A can be summed when calculating $Z_1$.

From these equations, the propagation constant for the distributed transmission line along the fingers can be calculated by the equation, $\gamma_{FING}=\sqrt{2Z_{FING}/Z_{SC}}$. As the effective width W of the pair of electrodes 20A, 22A increases, a contribution of the metal electrodes 20A, 22A to the total device impedance increases as well. As a result, the device impedance, $Z_0$, decreases slower with the effective width W as compared to a structure with zero-resistivity electrodes 20A, 22A. When the product, $\gamma_{FING}*W$, exceeds unity, the device impedance $Z_0$ can increase with the effective width W.

An embodiment determines a target effective width W of electrodes 20A, 22A as an effective width where $\gamma_{FING}*W \leq 2$. In this case, the total impedance per pair of electrodes 20A, 22A is close to the impedance of a structure with ideally conducting electrodes 20A, 22A (e.g., zero metal resistance). Similarly, an embodiment provides fabrication of multi-finger electrodes 20, 22 (FIG. 1) in which a target effective width W of each finger pair, such as a pair of fingers 20A, 22A and a pair of fingers 20B, 22B, is determined such that $\gamma_{FING}*W \leq 2$ to achieve a low total impedance $Z_0$ of the corresponding device 10.

Returning to FIGS. 1A-1C, one or more other attributes of the electrodes 20, 22 can be determined based on a total device resistance. For example, an embodiment provides a solution for designing and/or fabricating electrodes 20, 22 that includes determining one or more of: a total number of fingers 20A-20B, 22A-22B for each electrode 20, 22 comprising a comb configuration; a target depth, $d_{FING}$, of each finger 20A-20B, 22A-22B; a target length of each finger 20A-20B, 22A-22B; a target depth, $d_{CMB}$, of the current feeding contact 24A, 24B of each electrode 20, 22, respectively; a total length, $L_{CMB}$, of the interdigitated comb configuration of the two electrodes 20, 22; and/or the like.

For example, a target depth, $d_{FING}$, of each finger 20A-20B, 22A-22B can be determined based on a characteristic contact transfer length, $L_{TR}$, of a junction between electrodes 20, 22 and semiconductor structure 14. The characteristic contact transfer length $L_{TR}$ can be determined, for example, using the transmission line measurement (TLM) technique. The target depths of the fingers can be selected to provide a minimal resistance to the current flow through the fingers. In an embodiment, a target depth $d_{FING}$ for the first finger 20C and last finger 22C of the interface of electrodes 20, 22 can comprise a depth $d_{FING} \geq 3*L_{TR}$ (e.g., since each includes only a single adjacent finger in the structure), while the remaining fingers of each electrode 20, 22 can comprise a depth $d_{FING} \geq 6*L_{TR}$ (e.g., since each includes two adjacent fingers in the structure). Additionally, the design can include determining a target effective width W of each pair of fingers. For example, when the target depths $d_{FING}$ of the fingers are as described above, the target effective width W of each pair of fingers can be selected such that $\gamma_{FING}*W \leq 2$. As illustrated in FIG. 2, such an effective width will provide a minimal impedance for the device. A total width of each finger can comprise the effective width W plus approximately the length of the semiconductor between adjacent fingers, $L_{SC}$. Similarly, a total width between the current feeding contacts 24A, 24B can comprise the effective width W plus approximately $2*L_{SC}$.

An embodiment of the design further includes determining a target total length $L_{CMB}$ of the interdigitated comb configuration of the two electrodes 20, 22. To this extent, the design can include determining an impedance of the current feeding contacts 24A, 24B, $Z_{CMB}$, to determine the target total length $L_{CMB}$. $Z_{CMB}$ can be calculated, for example, using the formula $Z_{CMB}=R_{SHCMB}/d_{CMB}$, where $R_{SHCMB}$ is the sheet resistance of the current feeding contact and $d_{CMB}$ is the depth of the current feeding contact. $Z_{CMB}$ can be used to determine a propagation constant of the distributed transmission line along the current feeding contacts 24A, 24B, $\gamma_{CMB}$. For example, $\gamma_{CMB}$ can be calculated by the equation, $\gamma_{CMB}=\sqrt{2Z_{CMB}/Z_{FINGSC}}$, where $Z_{FINGSC}$ is the unit-length resistance of the pair of fingers with the semiconductor material in between. $Z_{FINGSC}$ can be calculated, for example, using the formula $Z_{FINGSC}=R_{SHSC} \times L_{SC}/W*(2d_{FING}+L_{SC})$, where $R_{SHSC}$ is the sheet resistance of the semiconductor structure 14. Subsequently, $L_{CMB}$ can be selected to provide a minimal resistance to the current flow. For example, similar to the effective width W as illustrated in FIG. 2, $L_{CMB}$ can be selected such that $L_{CMB}*\gamma_{CMB} \leq 2$. In particular, a similar relationship between the total length of the comb configuration can apply as described above with respect to the relationship of the effective width W of each finger pair. Since $\gamma_{CMB}$ depends on $d_{CMB}$, an embodiment of the design can determine a target depth $d_{CMB}$ of the current feeding contact 24A, 24B of each electrode 20, 22 that satisfies $L_{CMB}*\gamma_{CMB} \leq 2$. For example, when a target total device impedance $Z_0$ is given, the design can derive a required number of finger pairs and $L_{CMB}$ from the total impedance. In any event, from $L_{CMB}$, a total length of the current feeding contact of each electrode 20, 22 can be derived, e.g., by subtracting a depth of an end finger 20C, 22C and the length of the semiconductor between adjacent fingers, $L_{SC}$.

Figure 3B:
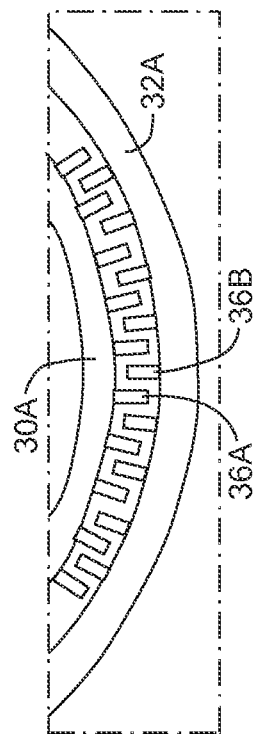
FIGS. 3A and 3B show illustrative circular electrode configurations according to embodiments.
Figure 3A:
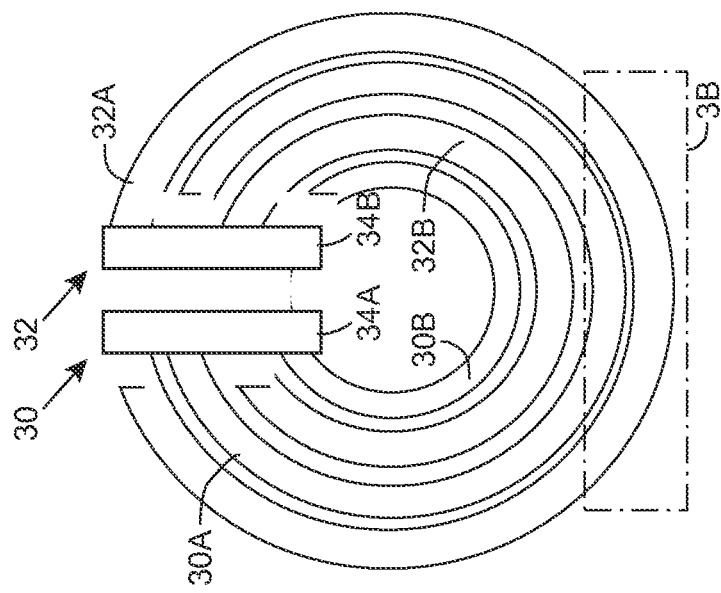

It is understood that the various target attributes can be determined for alternative electrode configurations. For example, FIGS. 3A and 3B show illustrative circular electrode configurations according to embodiments. As illustrated in FIG. 3A, the electrode configuration includes a pair of electrodes 30, 32, each of which comprises a current feeding contact 34A, 34B, respectively, and a plurality of electrode fingers 30A-30B, 32A-32B, respectively. Each electrode finger 30A-30B, 32A-32B comprises a partial elliptical (e.g., circular) shape. In this case, a solution for designing and/or fabricating electrodes 30, 32 can include determining one or more of: a total number of fingers 30A-30B, 32A-32B for each electrode 30, 32; a target depth of each finger 30A-30B, 32A-32B; a target length of each finger 30A-30B, 32A-32B; a target depth of the current feeding contact 34A, 34B of each electrode 30, 32, respectively; a total length of the interdigitated comb configuration of the two electrodes 30, 32; and/or the like. Electrodes 30, 32 can be configured to include any number of pairs of fingers 30A-30B, 32A-32B.

Additionally, as illustrated in FIG. 3B, each finger 30A-30B, 32A-32B can comprise a plurality of extensions, such as extensions 36A, 36B, one or more target attributes of which also can be determined as described herein. The target attributes of the extensions can be determined similar to the target attributes of the fingers shown in FIG. 1C and described herein, where each extension corresponds to a finger, and each finger corresponds to a current feeding contact. For example, a target depth of each extension, $d_{EXT}$, can be determined similar to the target depth of each finger $d_{FING}$ described herein, and a target effective width of a pair of adjacent extensions, $W_{EXT}$, can be determined similar to the target effective width of a pair of adjacent fingers W described herein. To this extent, the target depth of each extension $d_{EXT}$ can be selected to such that $d_{EXT} \geq 3*L_{TR}$ (for the end extensions) or $d_{EXT} \geq 6*L_{TR}$ (for all interior extensions). Similarly, the target effective width of each pair of adjacent extensions $W_{EXT}$ can be selected such that $\gamma_{EXT}*W_{EXT} \leq 2$, where $\gamma_{EXT} = \sqrt{2Z_{EXT}/Z_{SC}}$. While extensions 36A, 36B are only shown and described with reference to the partially elliptical fingers, it is understood that the fingers of FIG. 1A could be similarly configured with extensions between the pairs of fingers.

To this extent, target value(s) for one or more of the various attributes can be determined using similar formulas as described herein. However, one or more of the formulas can be modified to account for the circular configuration of electrodes 30, 32. For example, the target effective width W for a pair of fingers, such as fingers 30B, 32B, can be approximately correspond to an inner circumference of the larger finger (e.g., finger 32B). To this extent, a diameter, d, of the larger finger can be selected such that $\pi d\gamma \leq 2$, where $\gamma$ is calculated based on the impedance of the electrodes 30, 32 and a corresponding semiconductor structure using the same formula described above in calculating $\gamma_{FING}$.

A target value for one or more attributes, such as the characteristic contact transfer length, $L_{TR}$, the propagation constant, $\gamma$, and/or the like, can vary for an operating frequency of the device 10. To this extent, the target value(s) for one or more of the various attributes also can be determined based on a set of operating frequencies. For example, a plurality of optimal values for an attribute can be determined for direct current (DC) operation (corresponding to an operating frequency of zero) and one or more target operating frequencies for the device 10. Each optimal value can correspond to an optimum value for the corresponding attribute when the device is operated at the corresponding operating frequency. The frequency dependence of the attribute can be accounted for when calculating the optimal value using any solution. Illustrative solutions include, but are not limited to, representing current carrying element(s) by distributed equivalent circuits representing specific resistive, inductive, and capacitive components, solving differential equations for the current distribution accounting for such components, solving Maxwell equations accounting or not accounting for radiation resistance, by measuring the frequency dependent parameter (e.g., S-parameters, and/or the like), and/or the like. Subsequently, the plurality of optimal values can be used to determine a target value for the attribute, which can allow for a trade-off of the optimal values to optimize the overall performance of the device 10 using any solution. For example, the plurality of optimal values can be used to optimize a set of parameters for each operating frequency, create an objective function using the optimized sets of parameters, and select a set of target values for one or more attributes of the device 10 at a desired location on the objective function. The target value for an attribute also can be used in calculating the target values for one or more of the other various attributes, e.g., using one or more of the calculations described herein.

Aspects of the invention described herein can be applied to the design and fabrication of various types of devices for which operation of the device is improved when resistance between electrodes 20, 22 is reduced. For example, device 10 or a device with the electrode configuration of FIG. 3 can comprise a diode, such as a large periphery diode, a high current Schottky diode, a p-n junction diode, and/or the like. To this extent, one or more electrodes 20, 22 or 30, 32 can form a non-linear contact with the semiconductor structure 14. For example, electrodes 20, 22 can comprise different diode contacts, e.g., ohmic and Schottky or contacts to p- and n-regions of the semiconductor structure 14, and/or the like.

FIG. 4 shows a portion of another illustrative electrode configuration for a device 40 according to an embodiment. Device 40 can include multi-finger electrodes 20, 22 formed on a semiconductor structure 14. The fingers of electrodes 20, 22 can be designed to have the target effective width W as described herein. Additionally, device 40 includes a series of gate electrodes 42A-42D formed between the fingers of the electrodes 20, 22. Gate electrodes 42A-42D can be operated to selectively allow the flow of current between the fingers of electrodes 20, 22 using any solution.

In any event, after the electrodes have been configured, a device, such as device 10 (FIG. 1) or device 40, can be fabricated using any solution. To this extent, the fabrication of the device 10, 40 can include forming each of the corresponding electrodes of approximately the target effective width W as determined herein. Devices 10, 40 can each be implemented as a component in any of various types of circuits. For example, device 40 can be configured to operate as a field effect transistor (FET) within a circuit. To this extent, device 40 can comprise a FET that is used as a solid-state switch, an amplifier in a switching mode (e.g., class E, F), and/or the like.

While shown and described herein as a method of designing and/or fabricating a semiconductor device, it is understood that aspects of the invention further provide various alternative embodiments. For example, in one embodiment, the invention provides a method of designing and/or fabricating a circuit that includes one or more of the semiconductor devices designed and fabricated as described herein.

Figure 5:
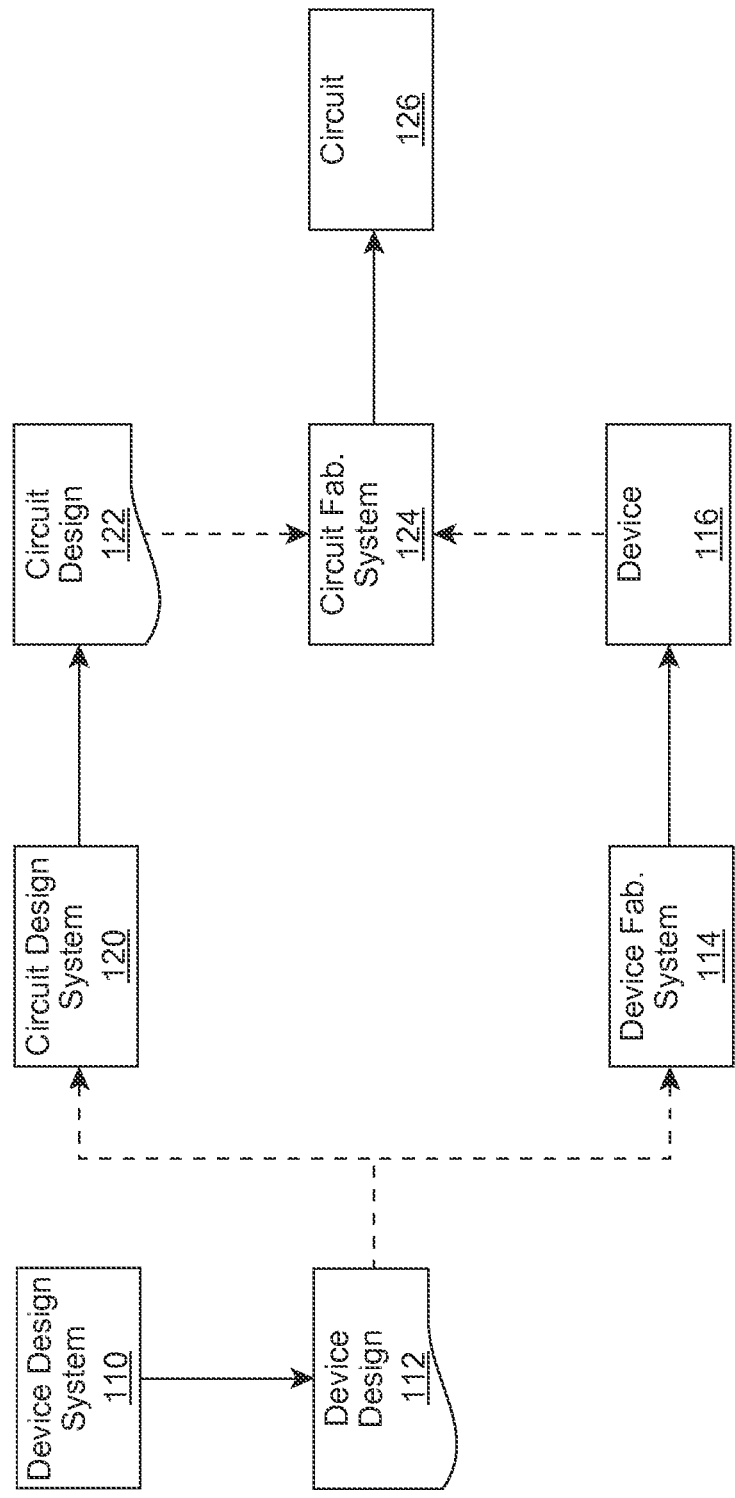
FIG. 5 shows an illustrative flow diagram for fabricating a circuit according to an embodiment.

To this extent, FIG. 5 shows an illustrative flow diagram for fabricating a circuit 126 according to an embodiment. Initially, a user can utilize a device design system 110 to generate a device design 112 using a method described herein. The device design 112 can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122. The circuit design 122 can include a device designed using a method described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed using a method described herein.

In another embodiment, the invention provides a device design system 110 for designing and/or a device fabrication system 114 for fabricating a semiconductor device 116 by applying the method described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated using a method described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor device comprising:
a first electrode and a second electrode to a semiconductor structure of the device, wherein each electrode includes a current feeding contact and a plurality of fingers extending therefrom, and wherein the plurality of fingers of the first and second electrodes are adjacent to each other in an alternating pattern, and wherein a depth, $d_{FING}$, for each end finger satisfies $d_{FING} \geq 3*L_{TR}$, and a depth for each and every interior finger satisfies $d_{FING} \geq 6*L_{TR}$, where $L_{TR}$ is a characteristic contact transfer length for a junction between the fingers and the semiconductor device.

2. The device of claim 1, wherein the characteristic contact transfer length is configured to optimize performance of the device at a set of operating frequencies for the device.

3. The device of claim 1, wherein an effective width, W, of each pair of adjacent fingers of the first electrode and the second electrode satisfies $\gamma_{FING}*W \leq 2$, where $\gamma_{FING} = \sqrt{2Z_{FING}/Z_{SC}}$, and where $Z_{FING}$ is an impedance of at least one finger per unit width and $Z_{SC}$ is an impedance of a portion of the semiconductor structure between the pair of adjacent fingers per unit width.

4. The device of claim 1, wherein a total length of the interface between the first and second electrodes, $L_{CMB}$, satisfies $L_{CMB}*\gamma_{CMB} \leq 2$, where $\gamma_{CMB} = \sqrt{2Z_{CMB}/Z_{FINGSC}}$, and where $Z_{CMB}$ is an impedance of the current feeding contact per unit width and $Z_{FINGSC}$ is an impedance of a pair of adjacent fingers with the semiconductor structure there between per unit width.

5. The device of claim 1, wherein a propagation constant of a distributed transmission line along at least one of: two adjacent fingers or the current feeding contacts is configured to optimize performance of the device at a set of operating frequencies for the device.

6. The device of claim 1, wherein each pair of adjacent fingers further includes a plurality of extensions extending there between, wherein the plurality of extensions for each pair of adjacent fingers are adjacent to each other in an alternating pattern.

7. The device of claim 6, wherein a depth, $d_{EXT}$, for each end finger satisfies $d_{EXT} \geq 3*L_{TR}$, and a depth for each and every interior finger satisfies $d_{EXT} \geq 6*L_{TR}$.

8. The device of claim 6, wherein an effective width, W, of each pair of adjacent extensions satisfies $\gamma_{EXT}*W \leq 2$, where $\gamma_{EXT} = \sqrt{2Z_{EXT}/Z_{SC}}$, and where $Z_{EXT}$ is an impedance of at least one finger per unit width and $Z_{SC}$ is an impedance of a portion of the semiconductor structure between the pair of adjacent fingers per unit width.

9. The device of claim 1, further comprising a gate electrode extending between each pair of adjacent fingers.

10. The device of claim 1, wherein the device is a planar device with a lateral layout, such that the plurality of fingers form a comb configuration.

11. The device of claim 1, wherein the plurality of fingers form a circular electrode configuration, and wherein a diameter, d, of a larger finger of a pair of adjacent fingers of the first electrode and the second electrode satisfies $\pi d \gamma \leq 2$, where $\beta = \sqrt{2Z_{FING}/Z_{SC}}$, and where $Z_{FING}$ is an impedance of at least one finger per unit width and $Z_{SC}$ is an impedance of a portion of the semiconductor structure between the pair of adjacent fingers per unit width.

12. The device of claim 1, further comprising a highly resistive substrate on which the semiconductor structure is located.

13. A semiconductor device comprising:
a first electrode and a second electrode to a semiconductor structure of the device, wherein each electrode includes a current feeding contact and a plurality of fingers extending therefrom, and wherein the plurality of fingers of the first and second electrodes are adjacent to each other in an alternating pattern, and wherein an effective width, W, of each pair of adjacent fingers of the first electrode and the second electrode satisfies $\gamma_{FING}*W \leq 2$, where $\gamma_{FING} = \sqrt{2Z_{FING}/Z_{SC}}$, and where $Z_{FING}$ is an impedance of at least one finger per unit width and $Z_{SC}$ is an impedance of a portion of the semiconductor structure between the pair of adjacent fingers per unit width.

14. The device of claim 13, wherein a total length of the interface between the first and second electrodes, $L_{CMB}$, satisfies $L_{CMB}*\gamma_{CMB} \leq 2$, where $\gamma_{CMB} = \sqrt{2Z_{CMB}/Z_{FINGSC}}$, and where $Z_{CMB}$ is an impedance of the current feeding contact per unit width and $Z_{FINGSC}$ is an impedance of a pair of adjacent fingers with the semiconductor structure there between per unit width.

15. The device of claim 14, wherein a depth, $d_{FING}$, for each end finger satisfies $d_{FING} \geq 3*L_{TR}$, and a depth for each and every interior finger satisfies $d_{FING} \geq 6*L_{TR}$, where $L_{TR}$ is a characteristic contact transfer length for a junction between the fingers and the semiconductor device.

16. The device of claim 13, wherein each pair of adjacent fingers further includes a plurality of extensions extending there between, wherein the plurality of extensions for each pair of adjacent fingers are adjacent to each other in an alternating pattern.

17. The device of claim 16, wherein a depth, $d_{EXT}$, for each end finger satisfies $d_{EXT} \geq 3*L_{TR}$, and a depth for each and every interior finger satisfies $d_{EXT} \geq 6*L_{TR}$.

18. The device of claim 16, wherein an effective width, W, of each pair of adjacent extensions satisfies $\gamma_{EXT}*W \leq 2$, where $\gamma_{EXT} = \sqrt{2Z_{EXT}/Z_{SC}}$, and where $Z_{EXT}$ is an impedance of at least one finger per unit width and $Z_{SC}$ is an impedance of a portion of the semiconductor structure between the pair of adjacent fingers per unit width.

19. The device of claim 16, further comprising a gate electrode extending between each pair of adjacent fingers.

20. The device of claim 16, wherein the device is a planar device with a lateral layout, such that the plurality of fingers form a comb configuration.

21. A semiconductor device comprising:
a first electrode and a second electrode to a semiconductor structure of the device, wherein each electrode includes a current feeding contact and a plurality of fingers extending therefrom, and wherein the plurality of fingers of the first and second electrodes are adjacent to each other in an alternating pattern, and wherein a total length of the interface between the first and second electrodes, $L_{CMB}$, satisfies $L_{CMB}*\gamma_{CMB} \leq 2$, where $\gamma_{CMB} = \sqrt{2Z_{CMB}/Z_{FINGSC}}$, and where $Z_{CMB}$ is an impedance of the current feeding contact per unit width and $Z_{FINGSC}$ is an impedance of a pair of adjacent fingers with the semiconductor structure there between per unit width.

22. The device of claim 21, wherein each pair of adjacent fingers further includes a plurality of extensions extending there between, wherein the plurality of extensions for each pair of adjacent fingers are adjacent to each other in an alternating pattern.

23. The device of claim 22, wherein a depth, $d_{EXT}$, for each end finger satisfies $d_{EXT} \geq 3*L_{TR}$, and a depth for each and every interior finger satisfies $d_{EXT} \geq 6*L_{TR}$.

24. The device of claim 22, wherein an effective width, W, of each pair of adjacent extensions satisfies $\gamma_{EXT}*W \leq 2$, where $\gamma_{EXT} = \sqrt{2Z_{EXT}/Z_{SC}}$, and where $Z_{EXT}$ is an impedance of at least one finger per unit width and $Z_{SC}$ is an impedance of a portion of the semiconductor structure between the pair of adjacent fingers per unit width.

25. The device of claim 21, further comprising a gate electrode extending between each pair of adjacent fingers.

26. The device of claim 21, wherein the device is a planar device with a lateral layout, such that the plurality of fingers form a comb configuration.

27. The device of claim 21, wherein the plurality of fingers form a circular electrode configuration, and wherein a diameter, d, of a larger finger of a pair of adjacent fingers of the first electrode and the second electrode satisfies $\pi d \gamma \leq 2$, where $\gamma = \sqrt{2Z_{FING}/Z_{SC}}$, and where $Z_{FING}$ is an impedance of at least one finger per unit width and $Z_{SC}$ is an impedance of a portion of the semiconductor structure between the pair of adjacent fingers per unit width.

* * * * *

UNITED STATES PATENT AND TRADEMARK OFFICE
CERTIFICATE OF CORRECTION

PATENT NO.         : 9,178,025 B2                                          Page 1 of 1
APPLICATION NO.    : 14/499652
DATED              : November 3, 2015
INVENTOR(S)        : Grigory Simin, Michael Shur and Remigijus Gaska It is certified that error appears in the above-identified patent and that said Letters Patent is hereby corrected as shown below:

In the claims

Column 11, line 12, claim 11,

"where $\beta=$" should read --where $\gamma=$--.

Signed and Sealed this
Fifth Day of January, 2016

Michelle K. Lee
*Director of the United States Patent and Trademark Office*